(12) United States Patent
Laslo et al.

(10) Patent No.: US 12,487,612 B2
(45) Date of Patent: Dec. 2, 2025

(54) AUTOMATIC DUAL PUMP SYSTEM WITH THREE-WAY VALVE

(71) Applicant: Opticool Solutions, LLC, Webster, NY (US)

(72) Inventors: David Laslo, Webster, NY (US); Robert Link, Webster, NY (US); Ryan Parsons, Webster, NY (US)

(73) Assignee: Opticool Solutions, LLC

( * ) Notice: Subject to any disclaimer, the term of this patent is extended or adjusted under 35 U.S.C. 154(b) by 52 days.

(21) Appl. No.: 18/478,468

(22) Filed: Sep. 29, 2023

(65) Prior Publication Data

US 2024/0111314 A1 Apr. 4, 2024

Related U.S. Application Data

(60) Provisional application No. 63/411,467, filed on Sep. 29, 2022.

(51) Int. Cl.
*H05K 7/20* (2006.01)
*F25B 1/10* (2006.01)
*G05D 7/06* (2006.01)

(52) U.S. Cl.
CPC ....... *G05D 7/0688* (2013.01); *H05K 7/20318* (2013.01); *H05K 7/20327* (2013.01); *H05K 7/20381* (2013.01); *H05K 7/20827* (2013.01); *F25B 1/10* (2013.01)

(58) Field of Classification Search
CPC ........... H05K 7/20327; H05K 7/20381; H05K 7/20827; F25B 1/10
See application file for complete search history.

(56) References Cited

U.S. PATENT DOCUMENTS

| | | | |
|---|---|---|---|
| 6,213,200 B1* | 4/2001 | Carter | F28C 1/14 261/153 |
| 2009/0218077 A1* | 9/2009 | Ko | F25B 13/00 62/515 |
| 2014/0007597 A1* | 1/2014 | Harvey | H05K 7/20318 62/190 |
| 2017/0150646 A1 | 5/2017 | Verronen et al. | |
| 2018/0139870 A1* | 5/2018 | Meadows | F28D 7/106 |
| 2018/0195794 A1* | 7/2018 | Saunders | F25B 7/00 |
| 2020/0093033 A1 | 3/2020 | Lunsman et al. | |

FOREIGN PATENT DOCUMENTS

| | | |
|---|---|---|
| CN | 107643810 | 1/2018 |
| JP | 2001107402 | 4/2001 |
| JP | 2008507659 | 3/2008 |

* cited by examiner

*Primary Examiner* — Lionel Nouketcha
(74) *Attorney, Agent, or Firm* — Woods Oviatt Gilman LLP; Katherine H. McGuire, Esq.

(57) ABSTRACT

An automatic dual pump assembly for a pumped refrigerant cooling system including a refrigerant reservoir for receiving a refrigerant fluid includes a first pump having a first pump inlet and a first pump outlet, a first variable frequency drive coupled to the first pump, a second pump having a second pump inlet and a second pump outlet, a second variable frequency drive coupled to the second pump, and a three-way valve having an input arm fluidly coupled to the refrigerant reservoir, a first outlet arm fluidly coupled to the first pump inlet, and a second outlet arm coupled to the second pump inlet. The first pump outlet and the second pump outlet are coupled to a refrigerant supply line, and the three-way valve selectively controls flow of the refrigerant fluid to one or both of the first pump and the second pump.

12 Claims, 5 Drawing Sheets

AUTOMATIC DUAL PUMP SYSTEM WITH THREE-WAY VALVE

FIELD OF THE INVENTION

The present invention generally relates to apparatus and methods for cooling electronic devices. More particularly, the present invention relates to apparatus and methods for providing redundant mechanical components for data center cooling systems.

BACKGROUND OF THE INVENTION

Managing airflow in a data center is overly complex, costly and ineffective. In addition, new high density server technology and storage virtualization platforms require high-density cooling. Various approaches have been suggested for cooling electronic equipment and/or rooms. Each of these approaches requires its own energy in order to remove the heat. However, this energy also adds additional heat to the system. By way of example, one approach for cooling equipment/rooms involves rear door heat exchangers (RDHx) which manage heat transfer by using built-in fans to draw heat from the server racks. Chilled water or refrigerant may be used to improve cooling efficiencies. While more effective than room-based or in-row cooling systems, RDHx units require a circulating flow of coolant which is usually provided by a separate pumped flow circuit. However, over time, mechanical parts wear down leading to reduced system efficiencies and possible system failure. Failure of the cooling circuit could thus lead to catastrophic damage to the electronic equipment through overheating or require server downtime in order to repair the cooling system. As such, there is a need for redundancy of mechanical parts to minimize, and hopefully eliminate, any server damage due to cooling system performance degradation.

SUMMARY OF THE INVENTION

The present invention introduces an automatic dual pump system that includes two pumps (impellers and motors) as well as two Variable Frequency Drives (VFDs) to drive the variable speed motors. In this system, a single pump operates until an event occurs that would trigger a switchover to the second pump. This event may include a loss of measured pressure differential, a VFD fault, or another indicator of pump failure.

A three-way valve controls the supply of refrigerant to the first pump or the second pump. The three-way valve may also be used in combination with the variable speed motors to ensure a smooth transition between the pumps. This smooth transition is necessary in order to avoid a sudden loss of mass flow entering the pumping unit's heat exchanger which can cause instability, particularly with the secondary circuit that rejects heat to the outside.

For instance, when a failure event occurs, the first pump will slow down (if able) while the second pump increases speed from its stopped position. In parallel, the three-way valve incrementally opens supply to the second pump and closes supply to the first pump until the second pump reaches the appropriate speed set point. At this point, the first pump is stopped and all system flow is generated by the second pump. In one aspect, the first pump may then be fluidly isolated from the system so that the first pump may be removed and repaired/swapped before being reintroduced to the system. As a result, the first and second pumps may be serially maintained without requiring any cooling system shutdowns or any substantial loss of cooling efficiency.

In a preferred embodiment, the present invention is directed to an automatic dual pump assembly for a pumped refrigerant cooling system. The automatic dual pump assembly comprises a refrigerant reservoir configured to receive a refrigerant fluid. A first pump has a first pump inlet coupled to the refrigerator reservoir and a first pump outlet coupled to a refrigerant supply line. A first variable frequency drive is operably coupled to the first pump. A second pump has a second pump inlet coupled to the refrigerator reservoir and a second pump outlet coupled to the refrigerant supply line. A second variable frequency drive is operably coupled to the second pump. A three-way valve has an input arm fluidly coupled to the refrigerant reservoir, a first outlet arm fluidly coupled to the first pump and a second outlet arm coupled to the second pump. The three-way valve is configured to selectively control flow of the refrigerant fluid to one or both of the first pump and the second pump.

A further aspect of the present invention may be directed to a control circuit operably coupled to the first variable frequency drive, the second variable frequency drive and the three-way valve. A first pressure sensor and a second pressure sensor may also be included. Each of the first and second pressure sensors is communicatively coupled to the control circuit and the control circuit measures a pressure differential between the first and second pressure sensors. The control circuit may then selectively control the first variable frequency drive, the second variable frequency drive and the three-way valve so as to minimize loss of mass flow of the refrigerant fluid when transitioning operation from the first pump to the second pump.

Other objects and advantages of the present invention will become apparent from the following description taken in connection with the accompanying drawings, wherein is set forth by way of illustration and example, embodiments of this invention.

BRIEF DESCRIPTION OF THE DRAWINGS

The invention will further be described, by way of example, with reference to the accompanying drawings.

DETAILED DESCRIPTION

Figure 1:
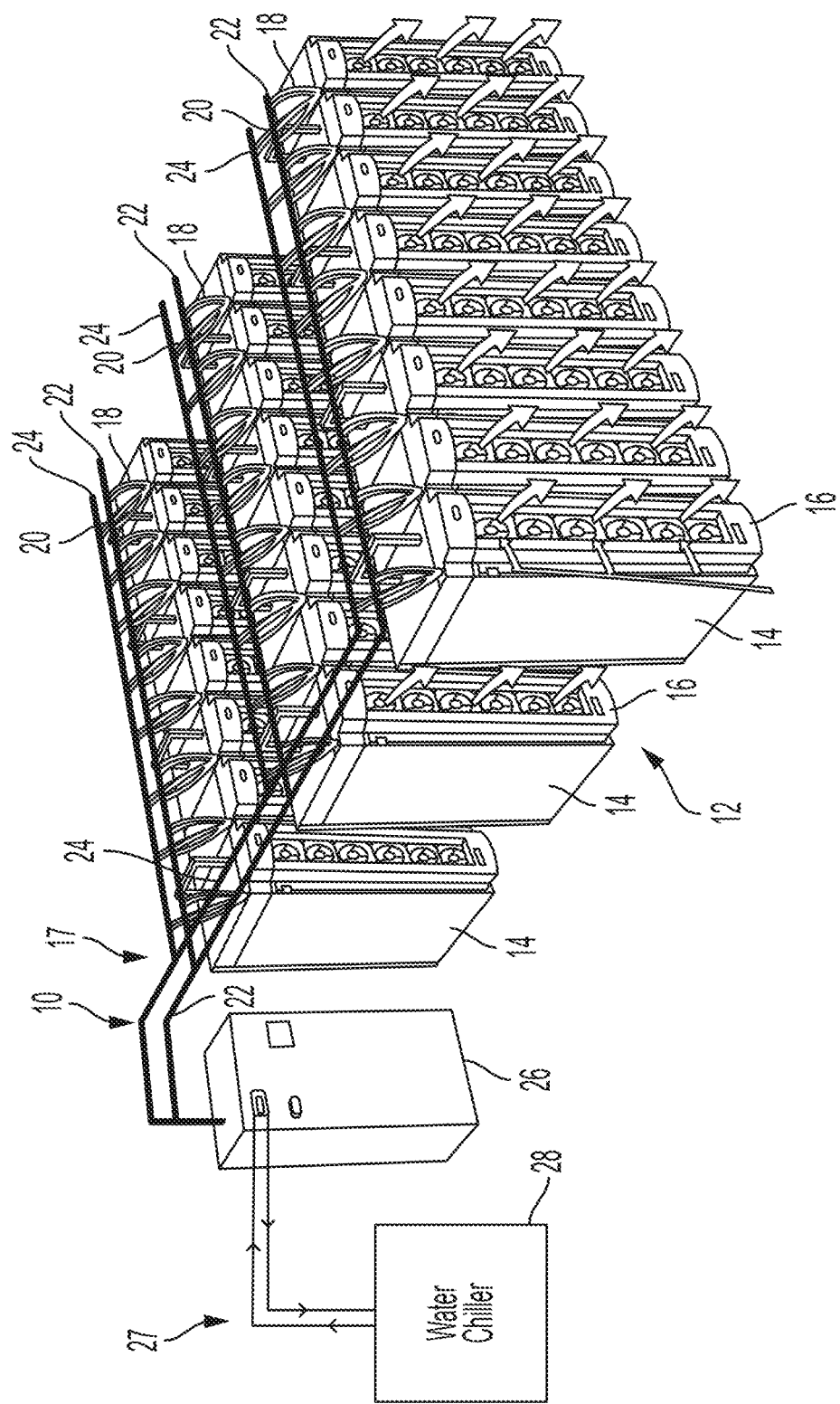
FIG. 1 is an environmental view of an exemplary data center suitable for including an embodiment of an automatic dual pump assembly in accordance with the invention.

Referring to FIG. 1, the present invention introduces an automatic dual pump assembly for a pumped refrigerant cooling system 10 which can be used in combination with critical infrastructure 12, such as a data center, cloud center, telecom switch room, etc. For sake of clarity, infrastructure 12 will be referred to throughout this description as a data center, with the understanding that the present disclosure need not be limited solely thereto. By way of example, data center 12 may include a plurality of server racks 14 containing the necessary computing, telecommunication and other equipment required for the particular infrastructure operations being performed by data center 12. Typically, this equipment requires a substantial amount of power to operate and, therefore, generates a lot of heat which may negatively impact the performance or lifespan of the equipment. As such, there has been a recognized need to cool the server racks.

By way of example, one such cooling system and method is described in U.S. Pat. No. 9,016,352 ("the '352 Patent"), the entirety of which is incorporated by reference herein. As disclosed in the '352 Patent, cooling system 10 may include a plurality of rack-mounted cooling doors 16 with each having one or more heat exchange modules mounted thereon. The heat exchange modules may then circulate refrigerant through a primary refrigeration circuit 17 including supply and return lines 18, 20 and supply and return trunks 22, 24. Refrigerant within return trunk 24 may be condensed via a secondary heat exchange circuit 27 (such as via a water chiller 28) and recirculated via a pump housed within pump unit 26. As discussed above, installing redundant mechanical components within critical infrastructure has become commonplace in many industries. Typically, this redundancy would require installation of an entire second pump unit 26 which would be costly and require a larger footprint.

Figure 2:
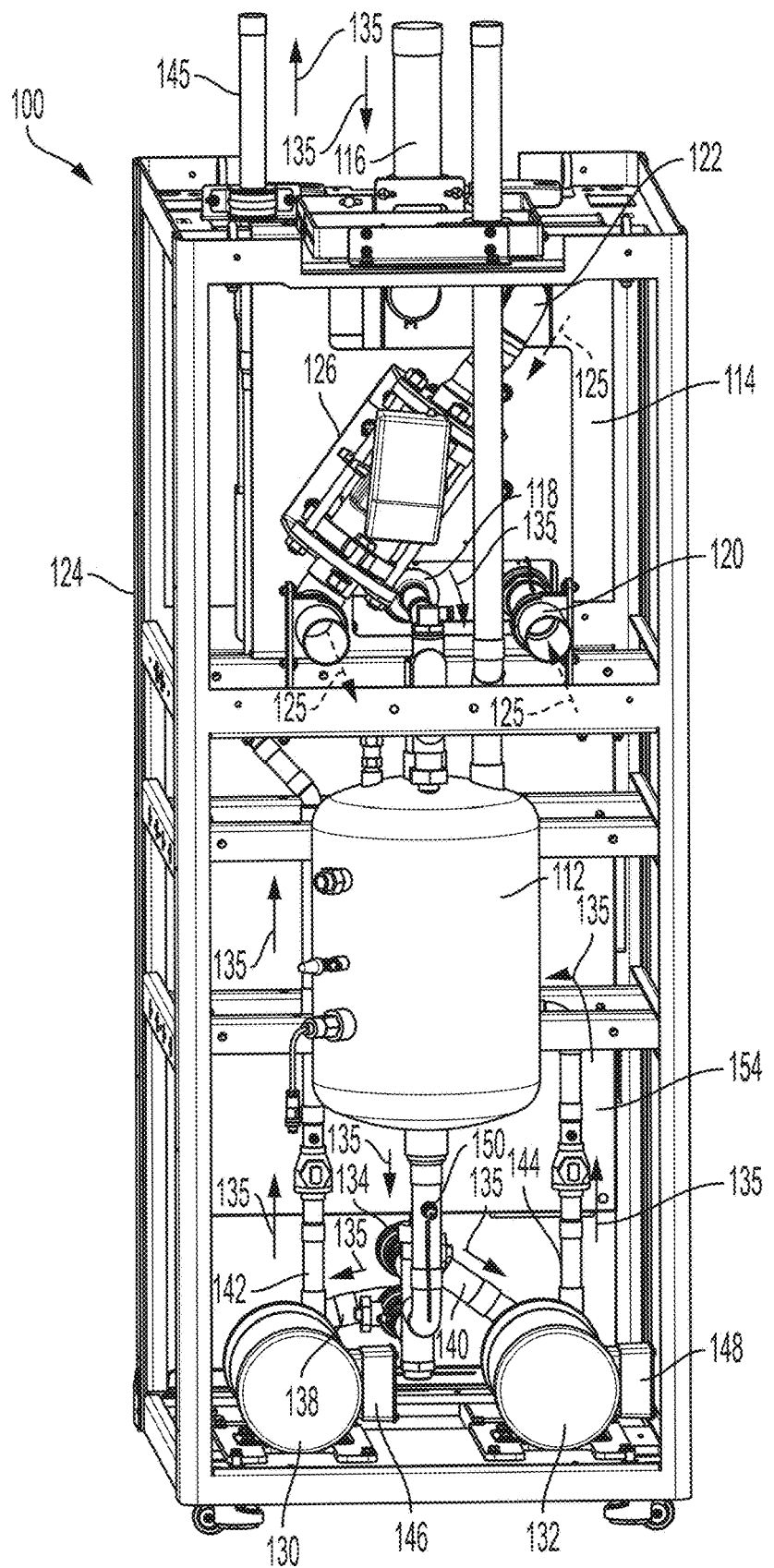
FIG. 2 is a perspective view of an embodiment of an automatic dual pump unit in accordance with the invention with the housing sidewalls removed.
Figure 3:
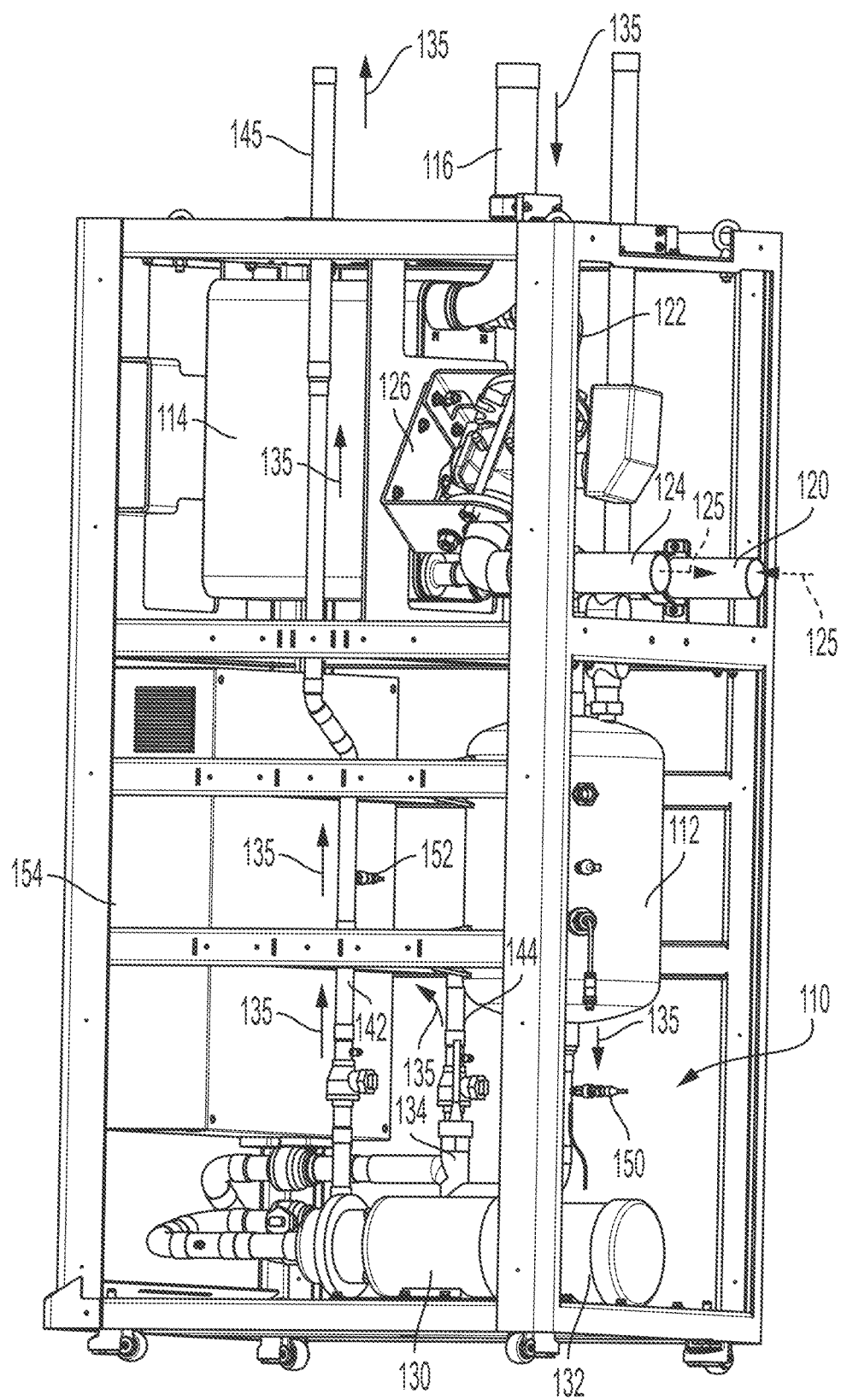
FIG. 3 is a side perspective view of the automatic dual pump unit shown in FIG. 2 with the housing sidewalls removed.

Turning now to FIGS. 2-5, shown is an exemplary embodiment of an automatic dual pump unit 100 configured for use within a pumped refrigerant cooling system, such as pumped refrigerant cooling system 10 described above. With particular reference to FIGS. 2 and 3, automatic dual pump unit 100 includes an automatic dual pump assembly 110 (also referred to as refrigerant pump assembly 110) configured to receive cooled refrigerant from refrigerant reservoir/tank 112 and pump the cooled refrigerant to the server racks (e.g., racks 14, FIG. 1). Refrigerant reservoir/tank 112 is charged with cooled refrigerant from condenser unit 114. Without limitation thereto, condenser unit 114 may be a chilled water condenser unit configured to circulate chilled water received from an externally located water chiller (e.g., chiller 28, FIG. 1). It should be further noted that while shown and described as a chilled water condenser unit, any suitable heat exchanger may be used to cool the hot refrigerant gas to condense the gas to liquid refrigerant.

As shown in FIGS. 2 and 3, condenser unit 114 includes a refrigerant inlet 116 configured to be coupled with a refrigerant return line (e.g., return trunk 24, FIG. 1) and a refrigerant outlet 118 fluidly coupled to refrigerant reservoir/tank 112. A refrigerant tube (not shown) is housed within condenser unit 114 between inlet 116 and outlet 118 so as to define a refrigerant flow path within condenser unit 114. Condenser unit 114 may further include a chilled water supply line 120 configured to be coupled to a water chiller (e.g., chiller 28) whereby a flow 125 of chilled water may assist condensation of the hot refrigerant gas received via refrigerant inlet 116. Chilled water outlet 122 may then be configured to return warmed water to the water chiller via chilled water return line 124. A water valve 126 may be located between outlet 122 and return line 124 so as to regulate the flow of the chilled water through condenser unit 114.

Figure 4:
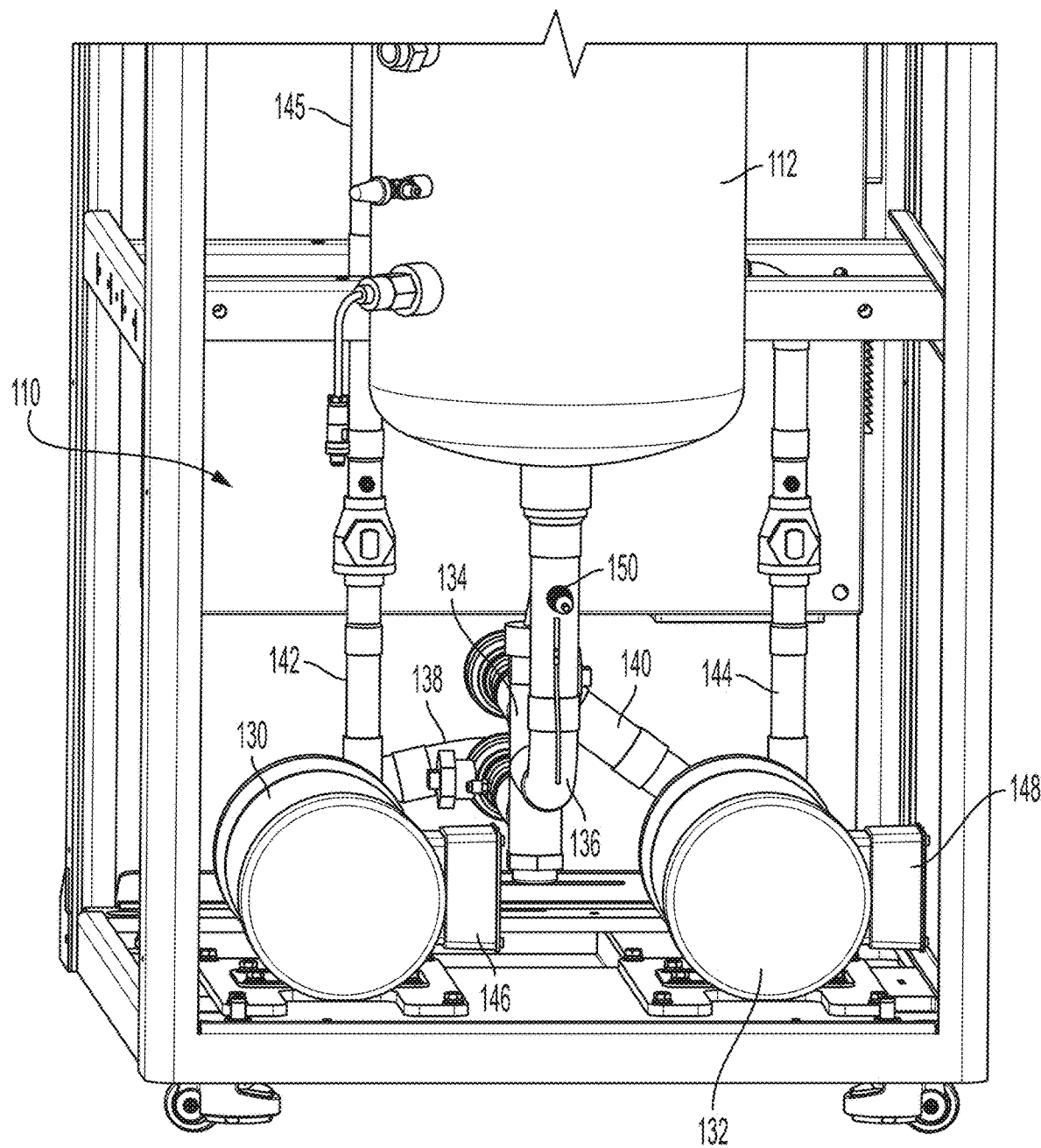
FIG. 4 is an expanded front view of the automatic dual pump unit shown in FIG. 2 showing an embodiment of an automatic dual pump assembly in accordance with the invention.
Figure 5:
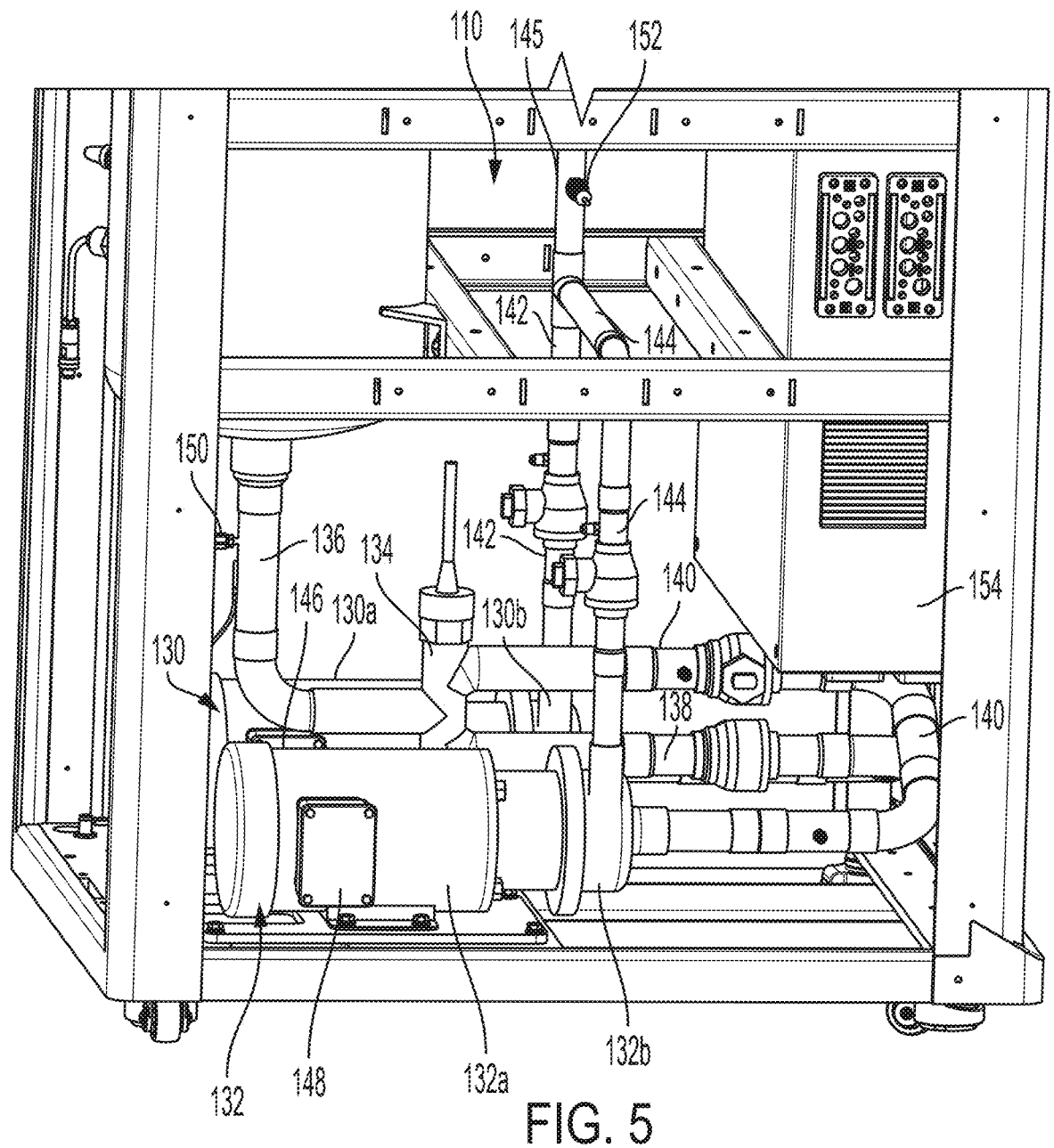
FIG. 5 is an expanded side view of the automatic dual pump unit shown in FIG. 3 showing an embodiment of an automatic dual pump assembly in accordance with the invention.

With additional reference to FIGS. 4 and 5, automatic dual pump assembly 110 generally includes a first pump 130 and a second pump 132 each fluidly coupled to the refrigerant reservoir/tank 112. Each of first pump 130 and second pump 132 may be embodied as a centrifugal pump including a respective motor 130a, 132a and impeller 130b, 132b. In one embodiment of the invention, three-way valve 134 is positioned between refrigerant reservoir/tank 112 and pumps 130, 132. Input arm 136 fluidly couples refrigerant reservoir/tank 112 to three-way valve 134. First outlet arm 138 of three-way valve 134 is fluidly coupled to first pump 130 while second outlet arm 140 of three-way valve 134 is coupled to second pump 132. As will be discussed in greater detail below, three-way valve 134 may then be configured to selectively control flow 135 of the refrigerant fluid to one or both of the first pump 130 and the second pump 132. First and second pumps 130, 132 are configured to discharge chilled refrigerant to respective outlet lines 142, 144 which may then be combined within refrigerant supply line 145 for eventual delivery to a supply trunk of the pumped refrigerant cooling system (e.g., supply trunk 22 of pumped refrigerant cooling system 10 as shown in FIG. 1).

With continued reference to FIGS. 4 and 5, automatic dual pump assembly 110 may further include a first variable frequency drive (VFD) 146 operably coupled to first pump 130 and a second variable frequency drive (VFD) 148 coupled to second pump 132. First pressure sensor 150 may be located between refrigerant reservoir 112 and three-way valve 134, such as on input arm 136 (FIGS. 3 and 4). Second pressure sensor 152 may then be located downstream first and second pumps 130, 132, such as on supply line 145 (FIGS. 3 and 5). First VFD 146, second VFD 148, first pressure sensor 150 and second pressure sensor 152 may each be communicatively and operably coupled to a control unit 154 housing a control circuit therein. The control circuit within control unit 154 may include executable instructions to measure a pressure differential between the first and second pressure sensors 150, 152. The control circuit may then selectively control the first variable frequency drive 146, the second variable frequency drive 148 and the three-way valve so as to minimize loss of mass flow of the refrigerant fluid when transitioning operation from the first pump to the second pump, as will be discussed in greater detail below.

In operation, only one pump (i.e., first pump 130) is used to circulate refrigerant fluid within the primary refrigeration circuit (e.g., circuit 17, FIG. 1). Control unit 154 monitors the performance of automatic dual pump assembly 110 until an event occurs that would trigger a switchover to operation of second pump 132, such as a failure event. By way of example and without limitation thereto, a failure event may include one or more of a loss of measured pressure differential (pressure sensors 150, 152), a VFD fault, or another indicator of pump failure as measured by the control unit 154. When a failure event occurs, the working pump, i.e., first pump 130 as presented in the current example, will slow down (i.e., rotation of impeller 130b will slow until stopped).

Concurrently, the idle pump (i.e., second pump 132) will be switched on by the control circuit such that motor 132a and impeller 132b increase rotational speed from their respective stopped resting positions. In parallel, three-way valve 134 may be commanded by the control circuit to incrementally open supply of refrigerant to second pump 132 and close supply of refrigerant to first pump 130 until second pump 132 is up to the appropriate speed set point (i.e., impeller 132b is rotating at the desired frequency).

Thus, as three-way valve 134 controls the supply of refrigerant to both the first pump 130 and second pump 132, three-way valve 134 may be used in combination with the variable frequency drives 146, 148 to ensure a smooth transition between the pumps 130, 132. This smooth transition may avoid a sudden loss of mass flow of refrigerant fluid entering condenser unit 114 and the instability caused thereby, particularly with respect to the secondary circuit (i.e., circuit 27, FIG. 1).

Although not shown in FIGS. 2-5, it should be appreciated that control unit 154 may include a memory device for storing the control software and a processor configured to execute the control software to implement methods, processes, and/or steps according to example embodiments described herein. It should be further noted that other suitable arrangements or modified configurations for the inlets/outlets/connections are also possible in some other example embodiments. Also, although not shown in the figures, additional sensors may be included, such as but not limited to a refrigerant temperature sensor configured to measure return refrigerant temperature, and water temperature sensors configured to measure the supply and return glycol/water temperatures to and from the water chiller.

Although the invention has been described with reference to example embodiments thereof, it is understood that various modifications may be made thereto without departing from the full spirit and scope of the invention as defined by the claims which follow.

What is claimed is:

1. An automatic dual pump assembly for a pumped refrigerant cooling system including a refrigerant reservoir configured to receive a refrigerant fluid, the automatic dual pump assembly comprising:
    a) a first pump having a first pump inlet and a first pump outlet, wherein the first pump outlet is coupled to a refrigerant supply line;
    b) a first variable frequency drive operably coupled to the first pump;
    c) a second pump having a second pump inlet and a second pump outlet, wherein the second pump outlet is coupled to the refrigerant supply line;
    d) a second variable frequency drive operably coupled to the second pump; and
    e) a three-way valve having an input arm configured to be fluidly coupled to the refrigerant reservoir, a first outlet arm fluidly coupled to the first pump inlet, and a second outlet arm coupled to the second pump inlet,
    wherein the three-way valve is configured to selectively control flow of the refrigerant fluid to one or both of the first pump and the second pump.

2. The automatic dual pump assembly of claim 1 further comprising a control circuit operably coupled to the first variable frequency drive, the second variable frequency drive and the three-way valve.

3. The automatic dual pump assembly of claim 2, further comprising:
    a) a first pressure sensor configured to measure an input fluid pressure of the refrigerant fluid entering the three-way valve; and
    b) a second pressure sensor configured to measure a supply fluid pressure of the refrigerate fluid exiting the first pump and/or the second pump,
    wherein each of the first and second pressure sensors is communicatively coupled to the control circuit whereby the control circuit measures a pressure differential between the first pressure sensor and the second pressure sensor.

4. The automatic dual pump assembly of claim 3, wherein the control circuit uses the measured pressure differential to selectively control the first variable frequency drive, the second variable frequency drive and the three-way valve so as to minimize loss of mass flow of the refrigerant fluid when transitioning operation from the first pump to the second pump.

5. The automatic dual pump assembly of claim 3, wherein the first pressure sensor is located on the input arm and the second pressure sensor is located on the refrigerant supply line.

6. A pumped refrigerant cooling system comprising:
    a) a condenser unit configured to receive a hot refrigerant gas and output a cold refrigerant fluid;
    b) a refrigerant reservoir configured to receive the cold refrigerant fluid from the condenser unit; and
    c) an automatic dual pump assembly configured to receive the cold refrigerant from the refrigerant reservoir, the automatic dual pump assembly comprising:
        i) a first pump having a first pump inlet and a first pump outlet, wherein the first pump outlet is coupled to a refrigerant supply line;
        ii) a first variable frequency drive operably coupled to the first pump;
        iii) a second pump having a second pump inlet and a second pump outlet, wherein the second pump outlet is coupled to the refrigerant supply line;
        iv) a second variable frequency drive operably coupled to the second pump; and
        v) a three-way valve having an input arm configured to be fluidly coupled to the refrigerant reservoir, a first outlet arm fluidly coupled to the first pump inlet, and a second outlet arm coupled to the second pump inlet,
    wherein the three-way valve is configured to selectively control flow of the cold refrigerant fluid to one or both of the first pump and the second pump.

7. The pumped refrigerant cooling system of claim 6 wherein the automatic dual pump assembly further comprises a control circuit operably coupled to the first variable frequency drive, the second variable frequency drive and the three-way valve.

8. The pumped refrigerant cooling system of claim 6 wherein the automatic dual pump assembly further comprises:
    a) a first pressure sensor configured to measure an input fluid pressure of the refrigerant fluid entering the three-way valve; and
    b) a second pressure sensor configured to measure a supply fluid pressure of the refrigerate fluid exiting the first pump and/or the second pump,
    wherein each of the first and second pressure sensors is communicatively coupled to the control circuit whereby the control circuit measures a pressure differential between the first pressure sensor and the second pressure sensor.

9. The pumped refrigerant cooling system of claim 8 wherein the control circuit uses the measured pressure differential to selectively control the first variable frequency drive, the second variable frequency drive and the three-way valve so as to minimize loss of mass flow of the refrigerant fluid when transitioning operation from the first pump to the second pump.

10. The pumped refrigerant cooling system of claim 8 wherein the first pressure sensor is located on the input arm and the second pressure sensor is located on the refrigerant supply line.

11. The pumped refrigerant cooling system of claim 6, wherein the condenser further comprises a chilled water closed circuit configured to assist cooling of hot refrigerant gas within the condenser to regenerate the cold refrigerant liquid.

12. The pumped refrigerant cooling system of claim 6 wherein the condenser, the refrigerant reservoir, and the automatic dual pump assembly define a closed refrigerant fluid circuit.

* * * * *